United States Patent
Liu

(10) Patent No.: US 11,814,727 B2
(45) Date of Patent: Nov. 14, 2023

(54) SYSTEMS AND METHODS FOR ATOMIC LAYER DEPOSITION

(71) Applicant: ASM IP HOLDING B.V., Almere (NL)

(72) Inventor: Eric Jen Cheng Liu, Tempe, AZ (US)

(73) Assignee: ASM IP Holding B.V., Almere (NL)

( * ) Notice: Subject to any disclaimer, the term of this patent is extended or adjusted under 35 U.S.C. 154(b) by 387 days.

(21) Appl. No.: 17/162,929

(22) Filed: Jan. 29, 2021

(65) Prior Publication Data

US 2021/0156026 A1    May 27, 2021

Related U.S. Application Data

(62) Division of application No. 15/785,231, filed on Oct. 16, 2017, now Pat. No. 10,927,459.

(51) Int. Cl.
    *C23C 16/455* (2006.01)
    *C23C 16/44* (2006.01)
    (Continued)

(52) U.S. Cl.
    CPC .... *C23C 16/45527* (2013.01); *C23C 16/4408* (2013.01); *C23C 16/45523* (2013.01);
    (Continued)

(58) Field of Classification Search
    CPC .......... C23C 16/45527; C23C 16/4408; C23C 16/45523; C23C 16/45544;
    (Continued)

(56) References Cited

U.S. PATENT DOCUMENTS 6,527,884 B1    3/2003    Takakuwa et al.
6,881,263 B2    4/2005    Lindfors et al.
(Continued)

FOREIGN PATENT DOCUMENTS

DE    3715644    12/1988
JP    H09-186111    7/1997
(Continued)

OTHER PUBLICATIONS

Office Action for Chinese Patent Application No. 200780002793.9, dated Mar. 15, 2010.
(Continued)

*Primary Examiner* — Jeffrie R Lund
(74) *Attorney, Agent, or Firm* — Snell & Wilmer L.L.P.

(57) ABSTRACT

An atomic layer deposition (ALD) method can include pulsing a first reactant vapor into a reactor assembly. The first reactant vapor is supplied to a first reactant gas line. An inactive gas is supplied to a first inactive gas line at a first flow rate. The first reactant vapor and the inactive gas are fed to the reactor assembly by way of a first feed line. The reactor assembly is purged by supplying the inactive gas to the first inactive gas line at a second flow rate higher than the first flow rate. A first portion of the inactive gas can be fed back along a diffusion barrier portion of the first reactant gas line to provide an inert gas valve (IGV) upstream of the first inactive gas line. A second portion of the inactive gas can be fed to the reactor assembly by way of the first feed line.

13 Claims, 4 Drawing Sheets

(51) Int. Cl.
*C23C 16/52* (2006.01)
*H01J 37/32* (2006.01)
*H01L 21/02* (2006.01)

(52) U.S. Cl.
CPC .. *C23C 16/45544* (2013.01); *C23C 16/45561* (2013.01); *C23C 16/52* (2013.01); *C23C 16/45525* (2013.01); *H01J 37/32449* (2013.01); *H01L 21/0228* (2013.01)

(58) Field of Classification Search
CPC .............. C23C 16/45561; C23C 16/52; C23C 16/45525; H01J 37/32449; C30B 23/02; C30B 25/14; H01L 21/0228
See application file for complete search history.

(56) References Cited

U.S. PATENT DOCUMENTS

| | | | |
|---|---|---|---|
| 7,018,478 B2 | 3/2006 | Lindfors et al. | |
| 7,846,499 B2 | 12/2010 | Blomberg | |
| 7,918,938 B2 | 4/2011 | Provencher et al. | |
| 8,017,527 B1 | 9/2011 | Dhas et al. | |
| 8,372,201 B2 | 2/2013 | Provencher et al. | |
| 9,388,492 B2 | 7/2016 | White et al. | |
| 9,455,138 B1 | 9/2016 | Fukazawa et al. | |
| 9,478,415 B2 | 10/2016 | Kimura et al. | |
| 9,574,268 B1 | 2/2017 | Dunn et al. | |
| 9,627,221 B1 | 4/2017 | Zaitsu et al. | |
| 10,927,459 B2 * | 2/2021 | Liu | C23C 16/45561 |
| 2001/0006095 A1 | 7/2001 | Snijders et al. | |
| 2001/0007041 A1 | 7/2001 | Hsu et al. | |
| 2001/0029979 A1 | 10/2001 | Zheng et al. | |
| 2001/0042523 A1 | 11/2001 | Kesala | |
| 2001/0054377 A1 | 12/2001 | Lindfors et al. | |
| 2002/0001971 A1 | 1/2002 | Cho | |
| 2002/0170598 A1 | 11/2002 | Girard et al. | |
| 2002/0019571 A1 | 12/2002 | Derderian et al. | |
| 2003/0198741 A1 | 10/2003 | Uchida et al. | |
| 2003/0232138 A1 | 12/2003 | Tuominen et al. | |
| 2004/0015300 A1 | 1/2004 | Ganguli et al. | |
| 2004/0083787 A1 | 5/2004 | Bondestam | |
| 2004/0087178 A1 | 5/2004 | Koyanagi et al. | |
| 2004/0101622 A1 | 5/2004 | Park et al. | |
| 2004/0113289 A1 | 6/2004 | Toda et al. | |
| 2004/0237893 A1 | 12/2004 | Park et al. | |
| 2004/0250853 A1 | 12/2004 | Snijders | |
| 2004/0261706 A1 | 12/2004 | Lindfors et al. | |
| 2005/0056211 A1 | 3/2005 | Lindfors et al. | |
| 2005/0066893 A1 | 3/2005 | Soininen | |
| 2005/0095859 A1 | 5/2005 | Chen et al. | |
| 2005/0211315 A1 | 9/2005 | Jorg | |
| 2005/0223982 A1 | 10/2005 | Park et al. | |
| 2006/0014398 A1 | 1/2006 | Song et al. | |
| 2006/0032445 A1 | 2/2006 | Shinriki et al. | |
| 2006/0045970 A1 | 3/2006 | Seo et al. | |
| 2008/0085226 A1 | 4/2008 | Fondurulia et al. | |
| 2008/0202416 A1 | 8/2008 | Provencher et al. | |
| 2009/0061083 A1 | 3/2009 | Chiang et al. | |
| 2009/0095364 A1 | 4/2009 | Itoh et al. | |
| 2009/0258504 A1 | 10/2009 | Nakaiso et al. | |
| 2009/0263578 A1 | 10/2009 | Lindfors et al. | |
| 2009/0320754 A1 | 12/2009 | Oya et al. | |
| 2010/0015335 A1 | 1/2010 | Kakimoto et al. | |
| 2010/0264117 A1 | 10/2010 | Ohmi et al. | |
| 2010/0266765 A1 * | 10/2010 | White | C23C 16/45544 427/248.1 |
| 2010/0272895 A1 | 10/2010 | Tsuda | |
| 2010/0279008 A1 | 11/2010 | Takagi | |
| 2011/0139272 A1 | 6/2011 | Matsumoto et al. | |
| 2011/0261329 A1 | 10/2011 | Schimmel et al. | |
| 2012/0156887 A1 | 6/2012 | Ono et al. | |
| 2012/0161405 A1 | 6/2012 | Mohn et al. | |
| 2012/0164329 A1 | 6/2012 | Blomberg | |
| 2012/0180719 A1 | 7/2012 | Inoue et al. | |
| 2012/0216712 A1 | 8/2012 | Paranjpe et al. | |
| 2012/0289057 A1 | 11/2012 | DeDontney | |
| 2012/0328780 A1 | 12/2012 | Yamagishi | |
| 2013/0019960 A1 | 1/2013 | Choi et al. | |
| 2013/0029496 A1 | 1/2013 | Bauer et al. | |
| 2013/0104992 A1 | 5/2013 | Yednak, III et al. | |
| 2013/0160709 A1 | 6/2013 | White et al. | |
| 2013/0344245 A1 | 12/2013 | Xia et al. | |
| 2014/0024223 A1 | 1/2014 | Kilpi et al. | |
| 2014/0033978 A1 | 2/2014 | Adachi et al. | |
| 2014/0217193 A1 | 8/2014 | Breiling et al. | |
| 2014/0261733 A1 | 9/2014 | Wu et al. | |
| 2014/0295084 A1 | 10/2014 | Shirai et al. | |
| 2014/0349469 A1 | 11/2014 | Sasagawa et al. | |
| 2015/0004798 A1 | 1/2015 | Chandrasekharan et al. | |
| 2015/0007770 A1 | 1/2015 | Chandrasekharan et al. | |
| 2015/0099066 A1 | 4/2015 | Huotari et al. | |
| 2015/0125591 A1 | 5/2015 | Hsieh et al. | |
| 2015/0184287 A1 | 7/2015 | Tsung et al. | |
| 2015/0234390 A1 | 8/2015 | Koyomogi et al. | |
| 2015/0284848 A1 | 10/2015 | Nakano et al. | |
| 2016/0040288 A1 | 2/2016 | Wu et al. | |
| 2016/0211147 A1 | 7/2016 | Fukazawa | |
| 2016/0240367 A1 | 8/2016 | Kimura et al. | |
| 2016/0273108 A1 | 9/2016 | Ge et al. | |
| 2016/0281232 A1 | 9/2016 | White et al. | |
| 2017/0121818 A1 | 5/2017 | Dunn et al. | |
| 2017/0125243 A1 | 5/2017 | Jang et al. | |
| 2017/0243722 A1 | 8/2017 | Leeser | |
| 2017/0342559 A1 | 11/2017 | Fukazawa et al. | |
| 2017/0350011 A1 | 12/2017 | Marquardt | |
| 2017/0352560 A1 | 12/2017 | Kato et al. | |
| 2017/0362713 A1 | 12/2017 | Karim et al. | |
| 2018/0151346 A1 | 5/2018 | Blanquart | |
| 2018/0155832 A1 * | 6/2018 | Hamalainen | C23C 16/45534 |
| 2018/0223429 A1 | 8/2018 | Fukazawa et al. | |
| 2018/0230591 A1 | 8/2018 | Jang et al. | |
| 2018/0311700 A1 | 11/2018 | Ashizawa et al. | |
| 2019/0035605 A1 | 1/2019 | Suzuki | |
| 2019/0112707 A1 * | 4/2019 | Liu | C23C 16/45527 |
| 2021/0118668 A1 * | 4/2021 | Nandwana | H01L 21/02164 |
| 2021/0156026 A1 * | 5/2021 | Liu | C23C 16/4408 |
| 2021/0262092 A1 * | 8/2021 | Rasheed | C23C 16/45544 |

FOREIGN PATENT DOCUMENTS

| | | | |
|---|---|---|---|
| JP | 2004-214622 | 7/2004 | |
| JP | 2005-113268 | 4/2005 | |
| JP | 4667541 B2 | 4/2011 | |
| WO | WO 90/10092 | 9/1990 | |
| WO | WO 01/29282 A2 | 4/2001 | |
| WO | WO-2004083485 A2 * | 9/2004 | ......... C23C 16/4412 |
| WO | WO 2010/047168 A1 | 4/2010 | |
| WO | WO 2014/163742 A1 | 10/2014 | |
| WO | WO 2015/190749 A1 | 12/2015 | |
| WO | WO 2017/026676 A1 | 2/2017 | |

OTHER PUBLICATIONS

Office Action for Chinese Patent Application No. 200780002793.9, dated Apr. 19, 2011.

Notice for Reasons for Rejection dated Feb. 28, 2012 for Japanese Patent Application No. 2008551324, filed Jul. 16, 2008, 5 pages.

* cited by examiner

SYSTEMS AND METHODS FOR ATOMIC LAYER DEPOSITION

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

The field relates to systems and methods for atomic layer deposition (ALD).

Description of the Related Art

Atomic Layer Deposition (ALD) is a method for growing highly uniform thin films onto a substrate. In a time-divided ALD reactor, the substrate is placed into reaction space free of impurities and at least two different volatile precursors (reactant gases) are injected in vapor phase alternately and repetitively into the reaction space. The film growth is based on self-limiting surface reactions that take place on the surface of the substrate to form a solid-state layer of atoms or molecules, because the reactants and the temperature of the substrate are chosen such that the alternately-injected vapor-phase precursor's molecules react only on the substrate with its surface layer. The reactants are injected in sufficiently high doses for the surface to be practically saturated during each injection cycle. Therefore, the process is highly self-regulating, being not dependent on the concentration of the starting materials, whereby it is possible to achieve extremely high film uniformity and a thickness accuracy of a single atomic or molecular layer. Similar results are obtained in space-divided ALD reactors, where the substrate is moved into zones for alternate exposure to different reactants. Reactants can contribute to the growing film (precursors) and/or serve other functions, such as stripping ligands from an adsorbed species of a precursor to facilitate reaction or adsorption of subsequent reactants.

The ALD method can be used for growing both elemental and compound thin films. ALD can involve alternate two or more reactants repeated in cycles, and different cycles can have different numbers of reactants. Pure ALD reactions tend to produce less than a monolayer per cycle, although variants of ALD may deposit more than a monolayer per cycle.

Growing a film using the ALD method can be a slow process due to its step-wise (layer-by-layer) nature. At least two gas pulses are alternated to form one layer of the desired material, and the pulses are kept separated from each other for preventing uncontrolled growth of the film and contamination of the ALD reactor. After each pulse, the gaseous reaction products of the thin-film growth process as well as the excess reactants in vapor phase are removed from the reaction space, or the substrate is removed from the zone that contains them. In time-divided examples, this can be achieved by pumping down the reaction space, by purging the reaction space with an inactive gas flow between successive pulses, or both. Purging employs a column of an inactive gas in the conduits between the reactant pulses. Purging is widely employed on production scale because of its efficiency and its capability of forming an effective diffusion barrier between the successive pulses. Regularly, the inert purging gas is also used as a carrier gas during reactant pulses, diluting the reactant vapor before it is fed into the reaction space.

Sufficient substrate exposure and good purging of the reaction space are desirable for a successful ALD process. That is, the pulses should be intense enough for the substrate to be practically saturated (in the flattened portion of the asymptotic saturation curve) and purging should be efficient enough to remove practically all precursor residues and undesired reaction products from the reactor. Purge times can be relatively long with respect to the precursor exposure times.

In order to accelerate the film growth process, there is a demand for methods that enable shortening of the purge periods and, thus, the pulse intervals. However, one of the most challenging factors contributing to the process cycle times is a temporal widening of the reactant vapor pulses. Successive pulses should be kept sufficiently separated, because the gases may be mixed if fed with too frequent intervals due to their finite rise and drop times. A widening of the pulse is the result of three main phenomena: a pressure gradient formed between the reactant and inert gas flows, gas diffusion, and gas adsorption onto and desorption from the surfaces of the reactor. All these effects cause mixing of the reactant vapor and the inert gas, which causes long purge times to ensure operation under proper ALD conditions. In travelling-wave pulsing methods, where reactants are injected into continuous inert carrier flows, the total pressure in the reactor feed line increases at the same time as the reactant partial pressure is increased in the line, which causes the pulses to be widened not only by diffusion and adsorption/desorption, but also by pressure gradient driven flow.

Thus, there remains a continuing need for accelerating thin film growth processes while reducing the effects of temporal widening of the reactant vapor pulses.

SUMMARY

The systems and methods of the present disclosure have several features, no single one of which is solely responsible for its desirable attributes. Without limiting the scope of this disclosure as expressed by the claims which follow, various features will now be discussed briefly. After considering this discussion, and particularly after reading the section entitled "Detailed Description," one will understand how the features described herein provide several advantages over traditional gas delivery methods and systems.

An atomic layer deposition (ALD) method is disclosed. The ALD method can include pulsing a first reactant vapor into a reactor assembly. The pulsing can comprise supplying the first reactant vapor to a first reactant gas line. The pulsing can comprise supplying an inactive gas to a first inactive gas line at a first flow rate. The pulsing can comprise feeding the first reactant vapor and the inactive gas to the reactor assembly by way of a first feed line. The ALD method can further include purging the reactor assembly. The purging can comprise supplying the inactive gas to the first inactive gas line at a second flow rate that is higher than the first flow rate. The purging can comprise feeding a first portion of the inactive gas back along a diffusion barrier portion of the first reactant gas line to provide an inert gas valve (IGV) upstream of the first inactive gas line. The purging can comprise feeding a second portion of the inactive gas to the reactor assembly by way of the first feed line.

In another embodiment, an atomic layer deposition (ALD) device is disclosed. The ALD device can include a reactor assembly and a first reactant gas line configured to supply a first reactant vapor from a first reactant vapor source. The ALD device can include a first inactive gas line configured to supply an inactive gas from an inactive gas source. The ALD device can include a first feed line communicating with each of the first reactant gas line and the first inactive gas line to supply the first reactant vapor and the inactive gas to the reactor assembly. The ALD device can include a drain line communicating with the first reactant gas line upstream of the first inactive gas line. The ALD device can include a first valve along the first inactive gas line, the first valve having an open state and a closed state. The ALD device can include a second valve along the first inactive gas line, the second valve comprising an adjustable valve configured to adjustably regulate gas flow through the first inactive gas line at a plurality of non-zero flow rates.

In another embodiment, an atomic layer deposition (ALD) device is disclosed. The ALD device can include a reactor assembly and an inactive gas distribution line configured to supply an inactive gas from an inactive gas source. The ALD device can include a flow controller configured to control an amount of the inactive gas that flows along the inactive gas distribution line. The ALD device can include a plurality of reactant gas lines communicating between a plurality of reactant vapor sources and the reactor assembly. The ALD device can include a plurality of inactive gas lines branching from the inactive gas distribution line downstream of the flow controller, each of the inactive gas lines configured to communicate inactive gas from the inactive gas distribution line to one of the reactant gas lines. The ALD device can include a bypass line branching from the inactive gas distribution line downstream of the flow controller, the bypass line configured to provide fluid communication between the inactive gas distribution line and a vacuum source.

BRIEF DESCRIPTION OF THE DRAWINGS

These and other features, aspects and advantages of the present invention will now be described with reference to the drawings of several embodiments, which embodiments are intended to illustrate and not to limit the invention.

DETAILED DESCRIPTION

Figure 1:
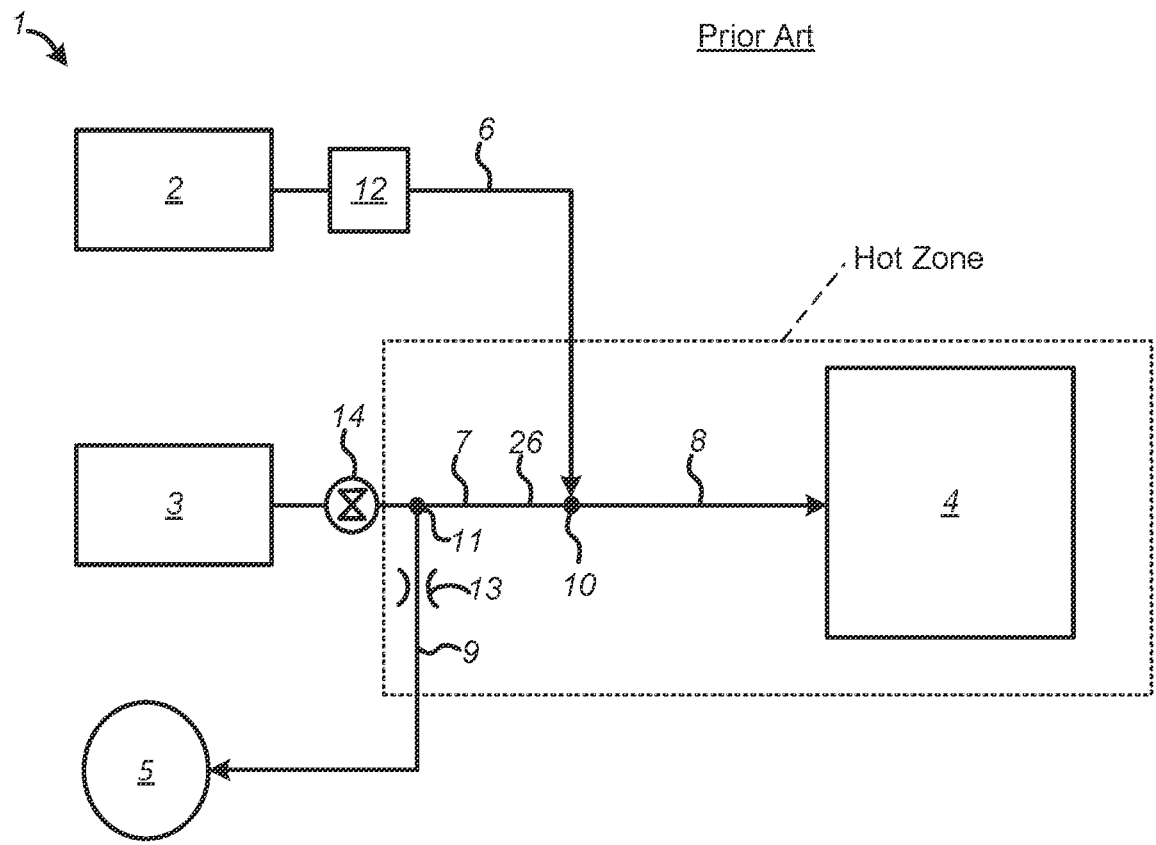
FIG. 1 is a schematic system diagram of a conventional atomic layer deposition (ALD) device.

The embodiments disclosed herein can be utilized with semiconductor processing devices configured for any suitable gas or vapor deposition process. For example, the illustrated embodiments show various systems for depositing material on a substrate using atomic layer deposition (ALD) techniques. Among vapor deposition techniques, ALD has many advantages, including high conformality at low temperatures and fine control of composition during the process. ALD type processes are based on controlled, self-limiting surface reactions of reactant chemicals. In a time-divided ALD reactor, gas phase reactions are avoided by feeding the precursors alternately and sequentially into the reaction chamber. Vapor phase reactants are separated from each other in the reaction chamber, for example, by removing excess reactants and/or reactant by-products from the reaction chamber between reactant pulses. Removal can be accomplished by a variety of techniques, including purging and/or lowering pressure between pulses. Pulses can be sequential in a continuous flow, or the reactor can be isolated and can be backfilled for each pulse.

Briefly, a substrate is loaded into a reaction chamber and is heated to a suitable deposition temperature, generally at lowered pressure. Deposition temperatures are typically maintained below the precursor thermal decomposition temperature but at a high enough level to avoid condensation of reactants and to provide the activation energy for the desired surface reactions. Of course, the appropriate temperature window for any given ALD reaction will depend upon the surface termination and reactant species involved.

A first reactant vapor is conducted into the chamber in the form of vapor phase pulse and contacted with the surface of a substrate. Conditions are preferably selected such that no more than about one monolayer of the precursor is adsorbed on the substrate surface in a self-limiting manner. Excess first reactant and reaction byproducts, if any, are purged from the reaction chamber, often with a pulse of inert gas such as nitrogen or argon.

Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times for a single wafer reactor are from about 0.05 to 20 seconds, such as between about 1 and 10 seconds, for example between about 1 and 2 seconds. However, other purge times can be utilized if desired, such as when depositing layers over extremely high aspect ratio structures or other structures with complex surface morphology is needed, or when a high volume batch reactor is employed. The appropriate phase and cycle times can be readily determined by the skilled artisan based on the particular circumstances.

A second reactant vapor is provided into the chamber where it reacts with species of the first reactant vapor bound to the surface. Excess second reactant vapor and gaseous by-products of the surface reaction are purged out of the reaction chamber, preferably with the aid of an inert or inactive gas. Providing the reactants alternately and purging are repeated until a thin film of the desired thickness has been formed on the substrate, with each cycle leaving no more than a molecular monolayer. Some ALD processes can have more complex sequences with three or more reactant pulses alternated. Reactants can also be supplied to the substrate in their own phases or with precursor pulses to strip or getter adhered ligands and/or free by-product, rather than contribute elements to the film. Additionally, not all cycles need to be identical. For example, a binary film can be doped with a third element by infrequent addition of a third reactant pulse, e.g., every fifth cycle, in order to control stoichiometry of the film, and the frequency can change during the deposition in order to grade film composition. Moreover, while described as starting with an adsorbing reactant, some recipes may start with another reactant or with a separate surface treatment, for example to ensure maximal reaction sites to initiate the ALD reactions (e.g., for certain recipes, a water pulse can provide hydroxyl groups on the substrate to enhance reactivity for certain ALD precursors).

As mentioned above, each pulse or phase of each cycle is preferably self-limiting. An excess of reactant precursors is supplied in each phase to practically saturate the susceptible structure surfaces. Surface saturation ensures reactant occupation of all available reactive sites (subject, for example, to physical size or steric hindrance restraints) and thus ensures excellent step coverage over any topography on the substrate. In some arrangements, the degree of self-limiting behavior can be adjusted by, e.g., allowing some overlap of reactant pulses to trade off deposition speed (by allowing some CVD-type reactions) against conformality. Ideal ALD conditions with reactants well separated in time and space provide near perfect self-limiting behavior and thus maximum conformality, but steric hindrance results in less than one molecular layer per cycle. Limited CVD reactions mixed with the self-limiting ALD reactions can raise the deposition speed. While embodiments described herein are particularly advantageous for sequentially pulsed deposition techniques, like ALD and mixed-mode ALD/CVD, the reactor assemblies disclosed herein can also be employed for pulsed or continuous CVD processing.

Examples of suitable reactors that may be used include commercially available ALD equipment such as any of the Pulsar®, EmerALD®, Eagle® series reactors, available from ASM International of Almere, the Netherlands. Many other kinds of reactors capable of ALD growth of thin films, including CVD reactors equipped with appropriate equipment and means for alternatingly supplying the reactants, can be employed.

The ALD processes can be carried out in a reactor or reaction space connected to a cluster tool in various embodiments. In a cluster tool, because each reaction space is dedicated to one type of process, the temperature of the reaction space in each module can be kept constant, which improves the throughput compared to a reactor in which is the substrate is heated to the process temperature before each run. A stand-alone reactor can be equipped with a load-lock. In that case, it is not necessary to cool down the reaction space between each run. These processes can also be carried out in a reactor designed to process multiple substrates simultaneously, e.g., a mini-batch type showerhead reactor. Still other types of reactor assemblies can be used in conjunction with the embodiments disclosed herein.

As compared with current ALD implementations, various embodiments disclosed herein can provide significantly higher purge flow rates and rapid increases in purge pressures, and can reduce temporal widening of the reactant vapor pulses. Beneficially, the embodiments disclosed herein can result in faster film growth by shortening the pulse widths and improving pulse separation. Moreover, improving pulse separation can beneficially reduce inter-mixing of the reactant vapor(s) and inactive gas(es) and can reduce contamination in the reactor assembly and in the various supply lines. Moreover, the inert gas valving (IGV) solutions presented herein can be provided outside the hot zone of the reactor assembly, such that the valves used in the reactant and inactive gas lines need not be exposed to the high temperatures of the reactor assembly, thus avoiding contamination issues raised by exposing valves to high temperatures. In addition, various embodiments disclosed herein may utilize a single flow controller that regulates the flow of inactive gas to multiple gas lines for multiple reactants of the system, as compared with other implementations that utilize multiple flow controllers, which can further reduce system costs. Relative to use of individual controllers, by the addition of relatively inexpensive parts, such as needle valves and an extra line (e.g., a foreline), the systems described herein permit individual control over gas conductance in multiple inactive gas lines to permit, for example, higher inert gas flow during purge states and faster activation of IGV to shut down reactant flow during purging. The embodiments disclosed herein can therefore significantly improve the productivity of the ALD process, resulting in reduced processing and assembly costs.

FIG. 1 is a schematic system diagram of a conventional atomic layer deposition (ALD) device 1 utilizing inert gas valving (IGV). The ALD device 1 can comprise an inert or inactive gas source 2 configured to supply an inactive gas to an inactive gas line 6. The inactive gas can comprise a gas that does not react with reactant vapor(s) or the substrate upon which the thin film is to be deposited. The inactive gas also serves to prevent reactions between the substances of the different reactant groups, for example by providing a diffusion barrier in the feed line to the reactor assembly between reactant phases. Any suitable type of inactive gases may be used in the embodiments disclosed herein, including, e.g., inert gases, such as nitrogen gas, and noble gases, e.g., argon. The inactive gas may also be an inherently reactive gas, such as hydrogen gas serving to prevent undesirable reactions, e.g., oxidization reactions, from occurring on the substrate surface, depending upon relative reactivity with the other reactants.

A flow controller 12 can control the amount of inactive gas (e.g., the flow rate) that is supplied to the inactive gas line 6. In various embodiments, the flow controller 12 can comprise a Mass Flow Controller (MFC), which can be configured to control an amount or flow rate of the inactive gas that is supplied to the inactive gas line 6. In other embodiments, other types of flow controllers may be used.

A reactant vapor source 3 can be configured to supply a vaporized precursor or reactant vapor to a reactant gas line 7. A reactant gas valve 14 can be configured to turn on or off the flow of reactant vapor through the reactant gas line 7 from the reactant gas source 3. The reactant gas valve 14 can be any suitable type of valve, including, e.g., solenoid-type valves, pneumatic valves, piezoelectric valves, etc. The reactant gas source 3 can provide reactant vapor. The reactant vapor can comprise a vaporizable material capable of reacting with the substrate surface or a previously reactant left on the substrate surface. The reactants may be naturally solids, liquids or gases under standard conditions, and accordingly may the reactant vapor source 3 may include a vaporizer. The reactant vapor source 3 may also include flow control device(s) upstream of the reactant gas valve 14. For vaporized reactants, the flow controller may control the flow of inert carrier gas through the vaporizer.

The term "metallic reactants" refers generally to metallic compounds, which may comprise elemental metals. Examples of metallic reactants are the halogenides of metals including chlorides and bromides, for instance, and metal-organic compounds such as the thd (2,2,6,6-tetramethyl-3, 5-heptanedione) complex compounds and Cp (—$C_5H_5$, cyclopentadienyl) compounds. More particular examples of metallic reactants include Zn, $ZnCl_2$, $TiCl_4$, $Ca(thd)_2$, $(CH_3)_3Al$ and $(Cp)_2Mg$. Nonmetallic reactants can comprise compounds and elements capable of reacting with metallic compounds. Nonmetallic reactants can comprise water, sulfur, hydrogen sulfide, oxygen, ozone and ammonia and as well as plasmas of different nonmetallic reactants such as hydrogen or hydrogen/nitrogen mixture. Still other types of vapor reactants may be used.

As shown in FIG. 1, a backsuction or drain line 9 can fluidly connect to the reactant gas line 7 at a junction 11. The drain line 9 can be fluidly connected to a vacuum source 5, and a flow restrictor 13 can be provided along the drain line 9 to restrict the flow of gases evacuated along the drain line 9. The flow restrictor 13 can be a passive device or a valve that does not fully close in operation. During operation, the vacuum source 5 can apply suction forces to the reactant gas line 7 at the junction 11, which may be disposed downstream of the reactant gas valve 14. In various embodiments, the vacuum source 5 may be activated during both dose states (in which reactant vapor(s) are supplied to the substrate) and purge states (in which the reactor assembly is purged of excess reactants and byproducts).

The inactive gas line 6 can join with the reactant gas line 7 at a junction 10. In various embodiments, when the reactant gas valve 14 is open, the vapor pressure of the reactant vapor can be sufficiently high so as to drive the reactant vapor along the reactant gas line 7. In other embodiments, the reactant vapor can be actively driven along the reactant gas line 7, e.g., the reactant vapor source 3 can include an inactive carrier gas supply to drive the reactant vapor along the reactant gas line 7. The inactive gas flow can be regulated along the inactive gas line 6 by the flow controller 12. During a pulsing or dosing state, the inactive gas can merge with the reactant vapor at the junction 10, and the merged vapors can be fed along a feed line 8 to a reactor assembly 4. In various arrangements, the reactor assembly 4 can include a processor chamber comprising a substrate support configured to support a substrate (such as a wafer). In some arrangements, a mixer is provided along the feed line 8 mix the reactant vapor with the inert gas flow prior to delivery to the process chamber. In other arrangements, no mixer is used, and the individual feed line(s) 8 may deliver the reactant and inactive gases to the process chamber. The ALD device 1 may also include baffles or expansion plenums along the feed line 8 to spread the flow of the reactant vapor and inert gases across the substrate.

During a dose state of the ALD device 1 shown in FIG. 1, the reactant gas valve 14 can be opened to feed reactant vapor to the reactant gas line 7. The total flow rate of gases into the reactor assembly 4 can be determined based on an inactive gas flow rate $F_I$ along the inactive gas line 6, a reactant vapor flow rate $F_R$ along the reactant gas line 7, and a drain flow rate $F_D$ along the drain line 9 from the junction 11 to the vacuum source 5. For example, the total flow into the reactor assembly 4 along the feed line 8 can be given by $F=F_I+F_R-F_D$. In the dose state, a pressure $P_A$ along the reactant gas line at the junction 11 is greater than a pressure $P_B$ at the junction 10 between the inactive gas line 6 and the reactant gas line 7. In the dose state, therefore, reactant vapor from the reactant gas line 7 and inactive gas from the inactive gas line 6 merge into the feed line 8 and are fed into the reactor assembly. In addition, a small portion of the reactant vapor is suctioned along the (restricted) drain line 9 by the vacuum source 5.

After a dose state of feeding reactant vapor to the reactor assembly 4, it can be important to purge the process chamber with inactive gas to remove all or substantially all excess reactant gases, byproducts, and other undesirable materials in the process chamber after dosing to prevent gas phase reactions with subsequent reactants. During a purge state or process, the reactant gas valve 14 can be closed in order to stop the flow of reactant vapor to the reactant gas line 7. After closing the reactant gas valve 14, the pressure $P_A$ at the junction 11 is less than the pressure $P_B$ at the junction 10. The pressure differential can cause residual precursor material and a portion of the inactive gas to flow back through the drain line 9 towards the vacuum source 5. Because the reactant gas valve 14 is closed during purging, only the inactive gas can flow along the feed line 8 to purge the reactor assembly 4 of undesirable species. This creates a backward flow of inactive gas along a diffusion barrier portion 26 of the reactant gas line 7 disposed between junction 10 and junction 11, which serves as a diffusion barrier against continued diffusion or flow of residual reactant in the reactant gas line 7. This diffusion barrier serves as the "inert gas valve" within the hot zone of the reactor, close to the reaction chamber, while actual valves and controllers 12, 14 can remain outside the hot zone and not subject to the wear of high temperatures and consequent contaminants. After purging, the process can repeat by initiating another dose state (typically of another reactant vapor) followed by another purge state, until the thin film has been grown on the substrate in the process chamber to a desired thickness and uniformity.

Although only one reactant vapor source 3 and one inactive gas source 2 are illustrated in FIG. 1, it should be appreciated that, a plurality of reactant vapor sources 3 and/or inactive gas sources 2 can be provided in an ALD device. In such arrangements, for each inactive gas line 6 that is provided, a corresponding flow controller 12 may also be provided to regulate the flow of inactive gas through that line 6. Similarly, for each reactive gas line 6, a corresponding reactant gas valve 14 can be provided.

As explained above, it can be important to provide high throughput in the ALD device 1 without contamination of the substrate and or reactor assembly 4. Accordingly, it can be important to ensure that the reactant vapors do not undesirably intermix with one another or with the inactive gas used in the purge state. Intermixing can occur due to a pressure gradient between the reactant and inactive gases, and can cause contamination of the reactor assembly 4 and/or substrate. Widening the pulses and/or increasing the pulse separation, however, can unduly increase the overall processing time used to form the thin film. The individual flow controller 12 along the inactive gas line permits increasing inert gas flow in the illustrated IGV system during purge states, which can advantageously result in faster purge, a better diffusion barrier and faster IGV shut off of the reactant. However, flow controllers, such as mass flow controllers, are quite costly and providing such control on each of several reactant gas lines multiplies the cost.

Figure 2:
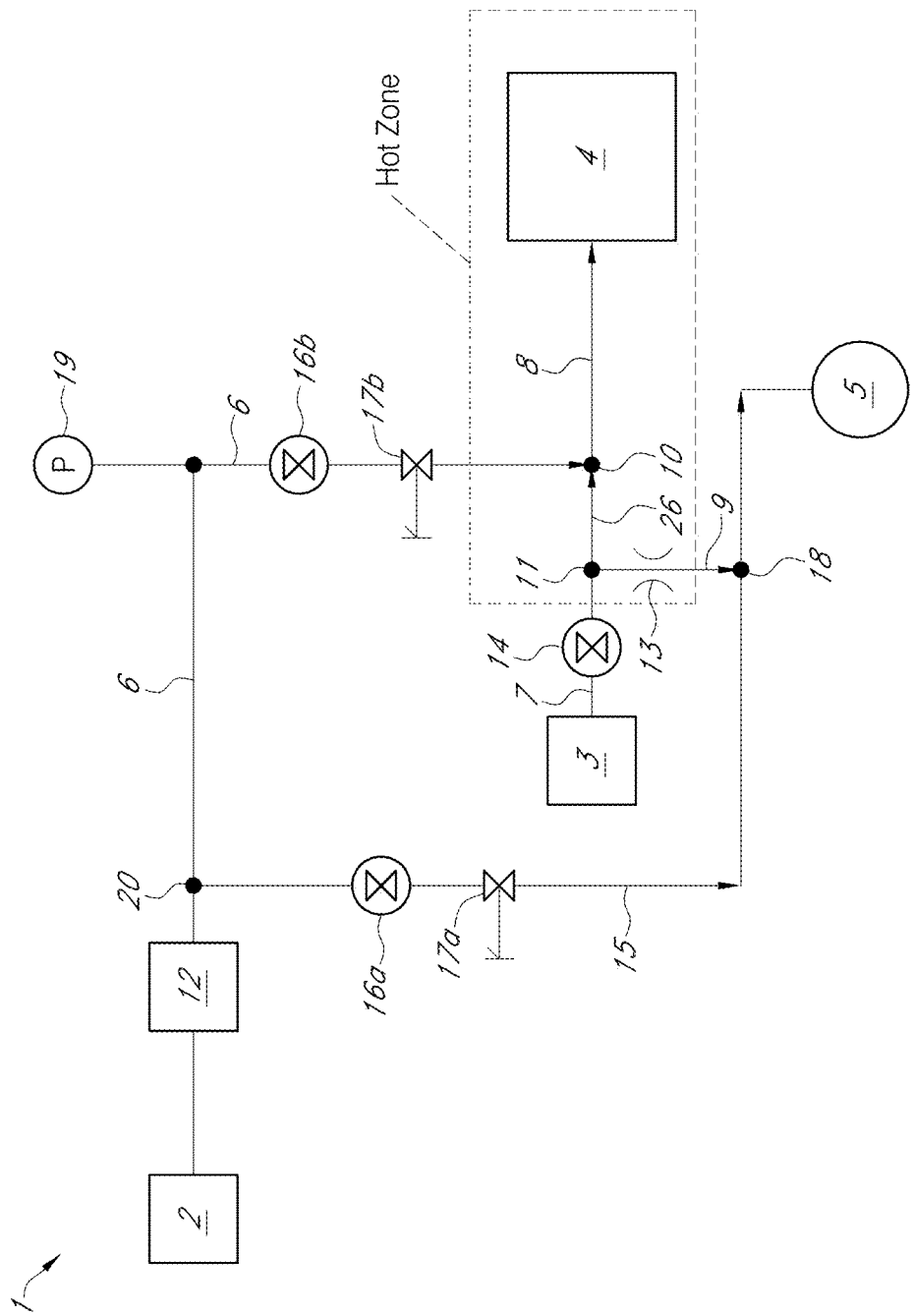
FIG. 2 is a schematic system diagram of an ALD device, according to one embodiment.

FIG. 2 is a schematic system diagram of an ALD device 1, according to one embodiment. Unless otherwise noted, components in FIG. 2 may be the same as or generally similar to like-numbered components of FIG. 1. As with FIG. 1, the device 1 of FIG. 2 includes an inactive gas source 2 configured to supply an inactive gas to an inactive gas line 6, and a reactant vapor source 3 configured to supply a reactant vapor to a reactant gas line 7. Further, the device 1 can comprise a feed line 8 configured to supply the reactant vapor and the inactive gas to a reactor assembly 4. As explained above, the reactor assembly can 4 comprise a mixer connected to multiple reactant sources and a process chamber downstream of the mixer. In other embodiments, the feed line(s) 8 can be fed directly to the processor chamber without an intervening mixer.

Furthermore, as with FIG. 1, the reactant gas valve 14 can be a shut-off valve to allow or prohibit the flow of reactant vapor from the reactant vapor source 3 to the reactant gas line 7. As noted with respect to FIG. 1, a mass flow controller may also be associated with the reactant vapor source 3, upstream or downstream of the pulsing valve reactant gas valve 14. The reactant gas line 7 can connect to the inactive gas line 6 at the junction 10. As explained above, during a dosing or pulsing state, reactant vapor can be entrained with the carrier inactive gas to feed reactant and inactive carrier gas to the reactor assembly 4 along the feed line 8. During a purging state, only the inactive gas may flow through the feed line 8 to the reactor assembly 4 to purge the reactor assembly 4 of undesirable species (e.g., excess reactant, byproducts, etc.).

Unlike the arrangement of FIG. 1, however, in FIG. 2, a bypass line (e.g., a foreline 15) can fluidly connect to the inactive gas line 6 downstream of the flow controller 12 between the flow controller 12 and the junction 10. In other embodiments, however, the bypass line may be located at other portions of the device 1. The foreline 15 can be in fluid communication with the vacuum source 5 (or a different vacuum source), which can apply suction forces to the inactive gas line 6 at a junction 20 between the foreline 15 and the inactive gas line 6. As shown in FIG. 2, a first shutoff valve 16a and a first adjustable valve 17a can be provided along and in fluid communication with the foreline 15. In various embodiments, the first shutoff valve 16a can comprise a valve having an open state and a closed state. In the open state, gas is permitted to freely flow through the valve 16a. In the closed state, gas is blocked from flowing through the valve 16a. In various embodiments, the shutoff valve 16a can have only two states, e.g., fully open or fully closed. In the illustrated embodiment, for example, the first shutoff valve 16a comprises a pneumatic valve operably controlled by a control system, which can comprise processing electronics configured to electronically activate the pneumatic valve. In other embodiments, however, the shutoff valve 16a can be adjustable or allow a trickle flow in the "closed" state.

The first adjustable valve 17a can comprise an adjustable valve configured to adjustably regulate gas flow through the foreline 15 at a plurality of non-zero flow rates. For example, in some embodiments, the adjustable valve 17a can adjust flow rates along a continuum of possible flow rates. In various embodiments, the adjustable valve 17a can be set at a predetermined set point that creates a desired pressure gradient across the valve 17a. In the illustrated embodiment, the first adjustable valve 17a can comprise a needle valve that can be adjusted manually or automatically to control a flow rate of gases being suctioned through the foreline 15. For example, in various embodiments, the first adjustable valve 17a can be set to a predetermined set point that provides a desirable pressure gradient across and/or flow rate through the valve 17a.

Further, as shown in FIG. 2, a drain line 9 can connect to the reactant gas line 7 at a junction 11. The drain line 9 can fluidly connect to the foreline 15 at a junction 18. A flow restrictor 13 can also be provided along the drain line 9 in some embodiments. When activated, the vacuum source 5 can also apply suction forces to the reactant line 7 at the junction 11 so as to draw gases back towards the vacuum source 5.

In addition, as shown in FIG. 2, the inactive gas line 6 can include a second shutoff valve 16b and a second adjustable valve 17b disposed between the junction 20 with the foreline 15 and the junction 10 with the reactant gas line 7. A pressure transducer 19 can be provided upstream of one or both the valves 16b, 17b to measure the pressure of the inactive gas flowing through the inactive gas line 6 upstream of the valves 16b and/or 17b. As with the first shutoff valve 16a, the second shutoff valve 16b can comprise a valve having an open state and a closed state. In the open state, gas is permitted to freely flow through the valve 16b. In the closed state, gas is blocked from flowing through the valve 16b. In various embodiments, the shutoff valve 16b can have only two states, e.g., fully open or fully closed. In the illustrated embodiment, for example, the second shutoff valve 16b comprises a pneumatic valve operably controlled by a control system, which can comprise processing electronics configured to electronically activate the pneumatic valve. In other embodiments, however, the shutoff valve 16b can be adjustable.

Similarly, the second adjustable valve 17b can comprise an adjustable valve configured to adjustably regulate gas flow through the inactive gas line 6 at a plurality of non-zero flow rates. For example, in some embodiments, the adjustable valve 17b can adjust flow rates along a continuum of possible flow rates. In various embodiments, the adjustable valve 17b can be set at a predetermined set point that creates a desired pressure gradient across the valve 17b. In the illustrated embodiment, the second adjustable valve 17b can comprise a needle valve that can be adjusted manually or automatically to control a flow rate of gases being suctioned through the inactive gas line 6. For example, in various embodiments, the second adjustable valve 17b can be set to a predetermined set point that provides a desirable pressure gradient across and/or flow rate through the valve 17b.

As explained above, it can be important in ALD processes to increase throughput, reduce processing times, improve the diffusion barrier, and reduce inert gas valving (IGV) shut-off speeds (e.g., the speed at which the process is switched from dosing to purging states, and vice versa). Various embodiments disclosed herein accomplish these objectives by significantly increasing the inactive gas flow rate $F_I$ along the inactive gas line 6 during purging of the reactor assembly 4. Increasing the inactive gas flow rate $F_I$ can result in a very rapid increase in pressure, which can accordingly result in a faster purge process, an improved diffusion barrier, and faster IGV switching speeds.

During a dose state or process, the first shutoff valve 16a and the first reactant valve 14 can be opened. The second shutoff valve 16b is also open during the dose state. Indeed, in various embodiments, the second shutoff valve 16b remains open during both the dose state and the purge state, such that some amount of inactive gas flows through the inactive gas line 6 during both dosing and purging. In the dose state, with the first and second shutoff valves 16a, 16b open, the first adjustable valve 17a can be set to provide a significantly greater conductance along the foreline 15 compared to the conductance along the inactive gas line 6 that is afforded by the setting of the second adjustable valve 17b. Accordingly, a majority of the inactive gas from the inactive gas source 2 and its flow controller 12 flows towards the vacuum source 5 along the foreline 15, which thus serves as a bypass or vent during dosing. A minority of the inactive gas can be fed through the inactive gas line 6 to the junction 10 with the reactant gas line 7. Advantageously, the set points of the adjustable valves 17a, 17b can be selected such that, during dosing, a majority of inactive gas flows through the foreline 15 and a minority of inactive gas flows through the inactive gas line 6 to the junction 10. For example, in some embodiments, the first adjustable valve 17a can be set to be more open than the second adjustable valve 17b such that, when the first shutoff valve 16a is opened, more inactive gas flows through the foreline 15 than through the inactive gas line 6. However, the apparatus is not so limited, and advantages can be obtained even if less than the majority of the inactive gas flow is fed through the foreline 15, as will be understood from the description of transition to purge states described below.

In the dose state, the pressure $P_A$ along the reactant gas line 7 at the junction 11 is greater than a pressure $P_B$ at the junction 10 between the inactive gas line 6 and the reactant gas line 7. In the dose state, therefore, reactant vapor from the reactant gas line 7 and the inactive gas from the inactive gas line 6 merge into the feed line 8 and are fed into the reactor assembly 4. In addition, a relatively small portion of the reactant vapor is suctioned backwards along the drain line 9 by the vacuum source 5 through the flow restrictor 13. For example, in some embodiments between about 3% and about 20% of the reactant vapor may be suctioned backwards along the drain line. In various embodiments, for example, between about 3% and about 5% of the reactant vapor can be suctioned backwards for a low vapor solid source (e.g., hafnium chloride). In some embodiments, between about 10% and about 20% of the reactant vapor can be suctioned backwards for relatively high vapor sources, such as water or ozone. In various embodiments, the amount suctioned backwards can depend on the size of the flow restrictor 13. The merged inactive and reactant gases pass into the processing chamber and react with the substrate to form a thin film.

After dosing, the processing chamber can be purged by closing the reactant gas valve 14 and the first shutoff valve 16a. As explained above, the second shutoff valve 16b can remain open during both dosing and purging. When the first shutoff valve 16a is closed, all (or substantially all) the inactive gas suddenly is driven through the inactive gas line 6, and no (or substantially no) inactive gas passes through the foreline 15. The sudden, increased flow of inactive gas through the inactive gas line 6 rapidly increases the flow rate and pressure of the inactive gas (e.g., the pressure $P_B$ at the junction 10 between the reactant gas line 7 and the inert gas line 6) during purging. The increased inactive gas flow through the inactive gas line 6 and the feed line 8 to the reactor assembly 4 to purge the reactor assembly 4 of undesirable species. After purging, another dosing state (which may comprise a different precursor or reactant vapor) can be implemented by opening the valves 14, 16a. The process can be sequentially repeated until the thin film on the substrate has reached the desired thickness and/or uniformity.

The increased flow rate and pressure of the inactive gas beneficially reduces the purge time, increases IGV switching speeds (e.g., the transition from dose state to purge state), and can shorten the pulsewidth and/or pulse interval of reactant gases. The diffusion barrier between the reactant and/or inactive gases can be improved due to the significantly higher pressure $P_B$ at the junction 10. As a result, ALD processing times and reactor system contamination can be significantly reduced and/or dilution of reactant vapors during dosing can be reduced. Furthermore, the IGV processes disclosed herein, e.g., the switching between dosing and purging states, may be regulated at least in part by the diffusion barriers provided by the pulsing and purging techniques disclosed herein. The physical valves 14, 16a, 16b, 17a, 17b and flow controller 12, 14 can advantageously be provided outside the hot zone created by the high processing temperatures associated with the reactor assembly 4. Thus, the valves 14, 16a-16b, and 17a-17b may be unaffected by the high processing temperature of the reactor assembly 4, and need not utilize specialized valves used in high temperature environments. At the same time, the diffusion barrier portion 26 between junction 10 and junction 11, serving as an inert gas valve, operates within the hot zone close to the reaction chamber 4, permitting rapid switching with minimal continued diffusion of reactant to the reaction chamber after the reactant flow is stopped.

Figure 3:
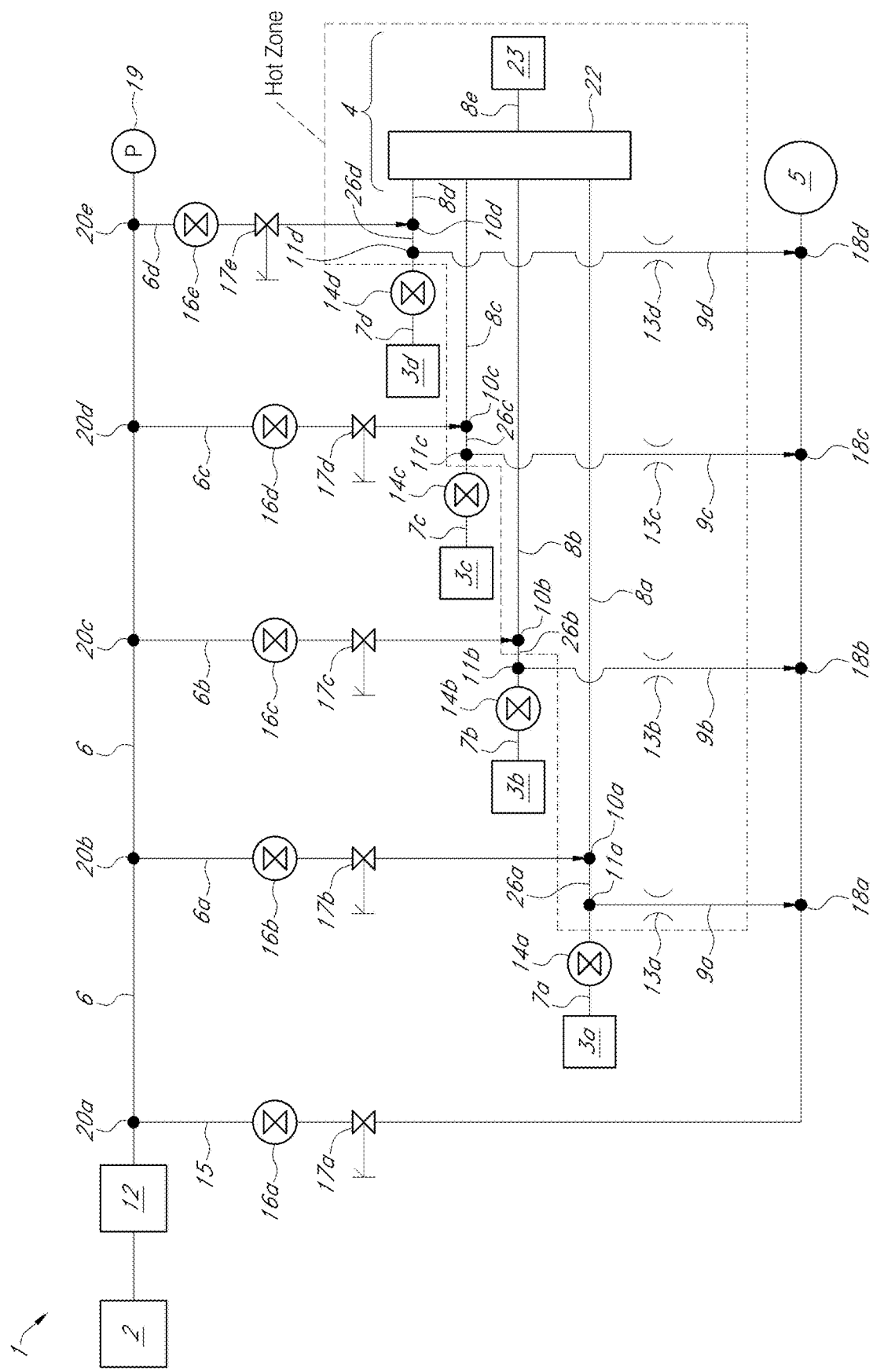
FIG. 3 is a schematic system diagram of an ALD device that includes a plurality of reactant gas sources, according to another embodiment.

FIG. 3 is a schematic system diagram of an ALD device 1 that includes a plurality of reactant gas sources 3a-3d, according to another embodiment. Unless otherwise noted, components in FIG. 2 may be the same as or generally similar to like-numbered components of FIG. 1. For example, as with FIG. 2, in FIG. 3, the device 1 can comprise an inactive gas source 2 and a flow controller 12 configured to supply inactive gas to an inactive gas distribution line 6. Further, a foreline 15 can connect with the inactive gas distribution line 6 at a junction 20a to serve as a selective bypass of the inactive gas distribution line 6 to a vacuum source 5. The first shutoff valve 16a and the first adjustable valve 17a can be provided along the foreline 15.

Unlike the embodiment of FIG. 2, in FIG. 3, a plurality of reactant vapor sources 3a-3d can be provided. Each reactant vapor source 3a-3d can contain vaporized reactant gases, which may differ from one another. Beneficially, using multiple (e.g., two, three, four as shown, five, six, etc.) reactant sources can enable the formation of more complex compounds on the substrate and/or redundant supplies of reactant to permit recharging reactant sources without halting deposition. Each reactant vapor source 3a-3d is connected to a corresponding reactant gas line 7a-7d. Corresponding reactant gas valves 14a-14d can be configured to allow or prohibit the respective gas flows from the reactant gas sources 3a-3d to the reactant gas lines 7a-7d. Furthermore, for each reactant gas line 7a-7d, corresponding drain lines 9a-9d can connect to the reactant gas lines 7a-7d at junctions 11a-11d. Corresponding flow restrictors 13a-13d can be provided along the drain lines 9a-9d between the junctions 11a-11d and the junctions 18a-18d along the foreline 15.

Furthermore, in FIG. 3, a plurality of inactive gas lines 6a-6d can fluidly connect to (and branch off from) the inactive gas distribution line 6. The plurality of inactive gas lines 6a-6d can connect to the inactive gas distribution line 6 at corresponding junctions 20b-20e as shown in FIG. 3. As with FIG. 2, each inactive gas line 6a-6d can comprise corresponding shutoff valves 16b-16e and corresponding adjustable valves 17b-17e. As with FIG. 2, the shutoff valves 16a-16e can comprise valves having an open state and a closed state. In the open state, gas is permitted to freely flow through the valves 16a-16e. In the closed state, gas is blocked from flowing through the valves 16a-16e. In various embodiments, the shutoff valves 16a-16e can have only two states, e.g., fully open or fully closed. In the illustrated embodiment, for example, the shutoff valves 16a-16e comprise pneumatic valves operably controlled by a control system, which can comprise processing electronics configured to electronically activate the pneumatic valve. In other embodiments, however, the shutoff valves 16a-16e can be adjustable or allow a trickle flow in the "closed" state.

The adjustable valves 17a-17e can be configured to adjustably regulate gas flow therethrough at a plurality of non-zero flow rates. For example, in some embodiments, the adjustable valves 17a-17e can adjust flow rates along a continuum of possible flow rates. In various embodiments, the adjustable valves 17a-17e can be set at predetermined set points that create desired pressure gradients across the valves 17a-17e. In the illustrated embodiment, the adjustable valves 17a-17e can comprise needle valves that can be adjusted manually or automatically to control flow rates of gases flowing therethrough. For example, in various embodiments, the adjustable valves 17a-17e can be set to different predetermined set points to control the relative flow of gases through the foreline 15 and through the inactive gas lines 6a-6d.

During a dose state of a first reactant from the first reactant source 3a, the first reactant valve 14a can be opened, and the first shutoff valve 16a of the foreline 15 can be opened (e.g., pneumatically in some embodiments). During the dose state, the shutoff valves 16b-16e along the respective inactive gas supply lines 6a-6d may remain open (e.g., fully open) during the entire deposition process, in some embodiments. For example, the shutoff valves 16b-16e can remain open during dosing of any and/or all reactant vapors, as well as during purging. In other embodiments, however, one or more of the shutoff valves 16b-16e can be closed during dosing and/or purging, e.g., if the associated reactant vapor is not being used in the deposition procedure.

When the first shutoff valve 16a along the foreline 15 is opened, a significant amount (for example, majority) of the inactive gas can flow through the foreline 15 towards the vacuum source 5, thus bypassing the inactive gas lines 6a-6d. Thus, less than all of the inactive gas metered by the flow controller 12 (for example, a minority of the inactive gas flow) can flow through the respective inactive gas lines 6a-6d to the respective junctions 10a-10d with the reactant lines 7a-7d. As explained in connection with FIG. 2, to set the relative amount of inactive gas flow through the foreline 15 during dosing, the first adjustable valves 17a-17e can be set at predetermined set points. For example, to set a majority of inactive gas flow through the foreline 15 during dosing, the first adjustable valve 17a along the foreline 15 can be set to provide more flow conductance than the total of the other adjustable valves 17b-17e. In such a manner, therefore, when the first shutoff valve 16a along the foreline 15 is opened, a significant amount (e.g., most) of the inactive gas can be suctioned into the foreline 15 rather than being driven into the respective inactive gas lines 6a-6d. As an example, the adjustable valves 17a-17e and the sizes of the gas lines 15, 6, 6a-6d can be selected such that, during dosing, between about 40% and 80% of the inactive gas flows through the foreline 15, e.g., between about 50% and 75% of the inactive gas in various embodiments.

For pulsing of the first reactant vapor from the first reactant source, for example, as explained above, the pressure $P_B$ at the junction 10 with the first inactive gas line 6a can be less than the pressure $P_A$ at the junction 11a between the reactant gas line 7a and the drain line 9a, due to a relatively small amount of inactive gas flow through the inactive gas line 6a. The first reactant vapor (which may include carrier gas that can be the same or different from the inactive gas) can merge with the inactive gas at the junction 10a, and the merged reactants and inactive gases can be fed to the reactor assembly 4 along feed line 8a. In the embodiment of FIG. 3, the reactor assembly 4 comprises a mixer 22 disposed upstream of and fluidly connected with a processing chamber 23 by way of feed line 8e, which can encourage more even mixing of the reactant vapor gas along feed line 8a with the inactive gas supplied through all of the active feed lines 8a-8d. Of course, for a two-reactant ALD sequence, two of the reactant lines 7a, 7b and corresponding inactive gas lines 6a, 6b can be active (valves 16b, 16c open while reactant valve 14a and 14b are pulsed) while two of the reactant lines 7c, 7d and corresponding inactive gas lines 6c, 6d are closed (valves 14c, 14d, 16d, 16e can be closed). The mixed gases can be fed to the processing chamber from the mixer 22 along the feed line 8e. As noted that, during pulsing of the first reactant vapor through the first feed line 8a, inactive gases may also flow (at relatively low flow rates) through the respective feed lines 8b-8d. In some embodiments, the different reactants from the reactant vapor sources 3a-3d may be fed to the reactor assembly 4 sequentially, e.g., during sequentially alternated dose states with intervening purge states. In other embodiments, operating in CVD mode or a hybrid CVD/ALD mode, more than one reactant may be fed to the reactor assembly 4 simultaneously (or substantially at the same time).

After pulsing the first reactant vapor to the reactor assembly 4 through the first feed line 8a, the reactor assembly 4 can be purged with inactive gas to remove excess reactant, byproducts, and/or other undesirable materials. In the purge state, the reactant gas valve 14a (and any other open reactant gas valves) and the first shutoff valve 16a are closed (e.g., pneumatically). As explained above, the inactive gas shutoff valves 16b-16e (at least those connected to active reactant lines 7 for the recipe) can remain open during both dosing and purging. When the first shutoff valve 16a is closed, all (or substantially all) the inactive gas suddenly is driven through the inactive gas distribution line 6, and no (or substantially no) inactive gas passes through the foreline 15. The inactive gas flowing through the inactive gas distribution line 6 can be distributed to the respective inactive gas lines 6a-6d. The sudden, increased flow of inactive gas through the inactive gas lines 6a-6d rapidly increases the flow rate and pressure of the inactive gas (e.g., the pressure $P_B$ at the junctions 10a-10d between the reactant gas lines 7a-7d and the inert gas lines 6a-6d) during purging. The rapidly-flowing inactive gas flows backward through the drains 9a-9d to form effective diffusion barriers at respective diffusion barrier portions 26a-26d between the respective junctions 10a-10d and 11a-11d, and through the inactive gas lines 6a-6d and the feed lines 8a-8d to the reactor assembly 4 to purge the reactor assembly 4 (e.g., the mixer 22 and/or process chamber 23) of undesirable species. After purging, another dosing state (which may comprise a different precursor or reactant vapor) can be implemented by opening the second reactant valve 14b and the shutoff valve 16a. The process can be sequentially repeated until the thin film on the substrate has reached the desired thickness and/or uniformity.

As explained above in relation to FIG. 2, the increased flow rate and pressure of the inactive gas beneficially reduces the purge time, increases IGV switching speeds (e.g., the transition from dose state to purge state), increases the effectiveness of the IGV diffusion barrier (e.g., in the diffusion barrier portions 26a-26d), and can shorten the pulsewidth and/or pulse interval of reactant gases. The diffusion barrier between the reactant and/or inactive gases can be improved due to the significantly higher pressure $P_B$ at the junctions 10a-10d. As a result, ALD processing times and reactor system contamination can be significantly reduced. Furthermore, the IGV processes disclosed herein, e.g., the switching between dosing and purging states, may be regulated at least in part by the diffusion barriers provided by the pulsing and purging techniques disclosed herein. The IGV processes can advantageously be provided outside the hot zone created by the high processing temperatures associated with the reactor assembly 4. Thus, the valves 14a-14d, 16a-16e, and 17a-17e may be unaffected by the high processing temperature of the reactor assembly 4, and need not utilize specialized valves used in high temperature environments.

While in some arrangements, multiple flow controllers (such as flow controllers 12) may be used to control the flow of inactive gases along the inactive gas lines. In such arrangements, for example, each inactive gas line may utilize an associated, separate flow controller (such as an MFC). However, the embodiment shown in FIG. 3 utilizes only a single flow controller 12 to regulate the flow of inactive gas for the entire device 1. By utilizing only one flow controller, the overall expense of the ALD device 1 may be significantly reduced, as compared with devices that utilize multiple flow controllers for the inactive gas. For example, for IGV on four separate reactant lines, the illustrated arrangement can employ one mass flow controller (MFC) at flow controller 12 and five needle valves for adjustable valves 17a-17d. As compared to four MFCs, the embodiment of FIG. 3 can provide individual control over relative flow rates during dosing and purging for one third the cost or less.

EXAMPLE IMPLEMENTATIONS OF ALD DEVICE

Table 1 illustrates a first example of adjustable valve 17a-17e set points, based on the system of FIG. 3, that can be used to improve purge speed and achieve the other aforementioned advantages associated with the disclosed embodiments. The parameters listed in Table 1 were calculated based on the flow controller 12 providing a flow rate of 2000 sccm for the inactive gas through the inactive gas distribution line 6 and assumes four active reactant gas lines 7a-7d. For the initial calibration of a particular valve 17a-17e, the pressure set point values referenced in Row 1 are the pressures as measured by the pressure sensor 19 when every other adjustable valve is closed. For example, the set point pressure of 700 Torr for valve 17b reflects the pressure measured by the sensor 19 when valve 17b is set at a particular predetermined set point, and the other valves 17a and 17c-17e are closed. The calibration can be repeated for the other valves 17c-17e.

TABLE 1

Example parameters for uniform distribution of inactive gas flow.

|  | Valve 17a (Foreline 15) | Valve 17b (Gas line 6a) | Valve 17c (Gas line 6b) | Valve 17d (Gas line 6c) | Valve 17e (Gas line 6d) |
|---|---|---|---|---|---|
| Pressure Set Point (Torr) | 90 | 700 | 700 | 700 | 700 |
| Flow Rate During Dose State (valve 16a open) (sccm) | 1320 | 170 | 170 | 170 | 170 |
| Flow Rate During Purge State (valve 16a closed) (sccm) | 0 | 500 | 500 | 500 | 500 |

The example shown in Table 1 illustrates the change in flow rates through the gas lines 6a-6d as the device is switched from dosing to purging. In Table 1, the valves 17b-17e have been set to allow relatively uniform flow of inactive gases through the inactive gas lines 6a-6d. As explained above, the first valve 17a of the foreline can be set at a pressure set point that is significantly more open than the combined conductance through the inactive gas lines 6a-6d, in some embodiments. Thus, during dosing, the shutoff valve 16a is opened, and a portion (e.g., a majority in some arrangements) of the inactive gas (1320 sccm) flows through the foreline 15. Another portion (e.g., a minority in some arrangements) of the inactive gas flows through each inactive gas line 6a-6d (170 sccm in each line). When the device is switched to the purge state (e.g., by closing the valve 16a), the flowrate through the foreline 15 drops to zero (or in some embodiments a trickle), and this additional inactive gas is routed evenly to the respective inactive gas lines 6a-6d because adjustable valves 17b-17e have the same settings in this example. As shown in Table 1, the flow through each inactive gas line 6a-6d increased from 170 sccm during dosing to 500 sccm during purging, e.g, an almost threefold increase in flow rate. The significantly increased flow during purging can significantly reduce processing times and can improve the diffusion barrier, as explained herein.

Table 2 illustrates a second example of adjustable 17a-17e set points, based on the system of FIG. 3, that can increase purge flow for the adjustable valves 17b and 17c associated with the second and third inactive gas lines 6b, 6c, respectively. In some processes, for example, the user may desire to preferentially increase purging through inactive gas lines 6b, 6c as compared with the inactive gas lines 6a, 6d. As with Table 1, the values of Table 2 are associated with a flow rate of 2000 sccm of inactive gas provided by the flow controller 12 to the inactive gas distribution line 6.

TABLE 2

Example parameters for preferential purge flow through inactive gas lines 6b, 6c.

|  | Valve 17a (Foreline 15) | Valve 17b (Gas line 6a) | Valve 17c (Gas line 6b) | Valve 17d (Gas line 6c) | Valve 17e (Gas line 6d) |
|---|---|---|---|---|---|
| Pressure Set Point (Torr) | 90 | 365 | 900 | 900 | 365 |
| Flow Rate During Dose State (valve 16a open) (sccm) | 1182 | 291 | 118 | 118 | 291 |
| Flow Rate During Purge State (valve 16a closed) (sccm) | 0 | 289 | 711 | 711 | 289 |

As shown in Table 2, the set points of valves 17c, 17d can be set at higher pressure set points as compared with the valves 17b, 17e. Increasing the pressure set points can correspond to creating an increased pressure gradient in the particular valve. As shown in Table 2, this increased pressure gradient can significantly increase the purge flow rates through gas lines 6b, 6c. For example, as shown in Table 2, for each of lines 6b, 6c, the dosing flow rate of 118 sccm can be substantially increased to 711 sccm for purging, e.g., an approximately sixfold increase in flow rate. By contrast, the flow rates through the lines 6a, 6d do not appreciably change as the device is switched from dosing to purging. For example, for the unused gas lines 6a, 6d, the setting of the valves 17a, 17d may allow for less of a pressure regulation shift from the dosing to purge states, such that most of the pressure regulation shift may occur on the used gas lines 6b, 6c.

Table 3 illustrates a third example of adjustable 17a-17e set points, based on the system of FIG. 3, that can further increase purge rates through inactive gas lines 6b, 6c. For example, in some process sequences, one or more of the reactant gas sources may not be used. In such arrangements, the shutoff valve associated with the inactive gas line that feeds into the associated reactant gas line may be closed. In the example of Table 3, the first reactant gas source 7a is not being used, and the shutoff valve 16b associated with the inactive gas line 6a is closed. Shutting off the shutoff valve 16b can beneficially cause more inactive gas to flow through the gas lines 6b, 6c, as compared with the example shown in Table 2. For example, since gas line 6a is shut off in this example, the additional inactive gas flow can flow through gas lines 6b, 6c. The flow of inactive gas through gas line 6d does not appreciably increase because the restrictions in the valves 17c, 17d permit more flow through the gas lines 6b, 6c, than does the valve 17e for gas line 6d.

TABLE 3

Example parameters for preferential purge flow through inactive gas lines 6b, 6c with shutoff valve 16b closed.

| | Valve 17a (Fore-line 15) | Valve 17b (Gas line 6a) | Valve 17c (Gas line 6b) | Valve 17d (Gas line 6c) | Valve 17e (Gas line 6d) |
|---|---|---|---|---|---|
| Pressure Set Point (Torr) | 90 | N/A | 900 | 900 | 365 |
| Flow Rate During Dose State (valve 16a open) (sccm) | 1383 | 0 | 138 | 138 | 341 |
| Flow Rate During Purge State (valve 16a closed) (sccm) | 0 | 0 | 831 | 831 | 338 |

Figure 4:
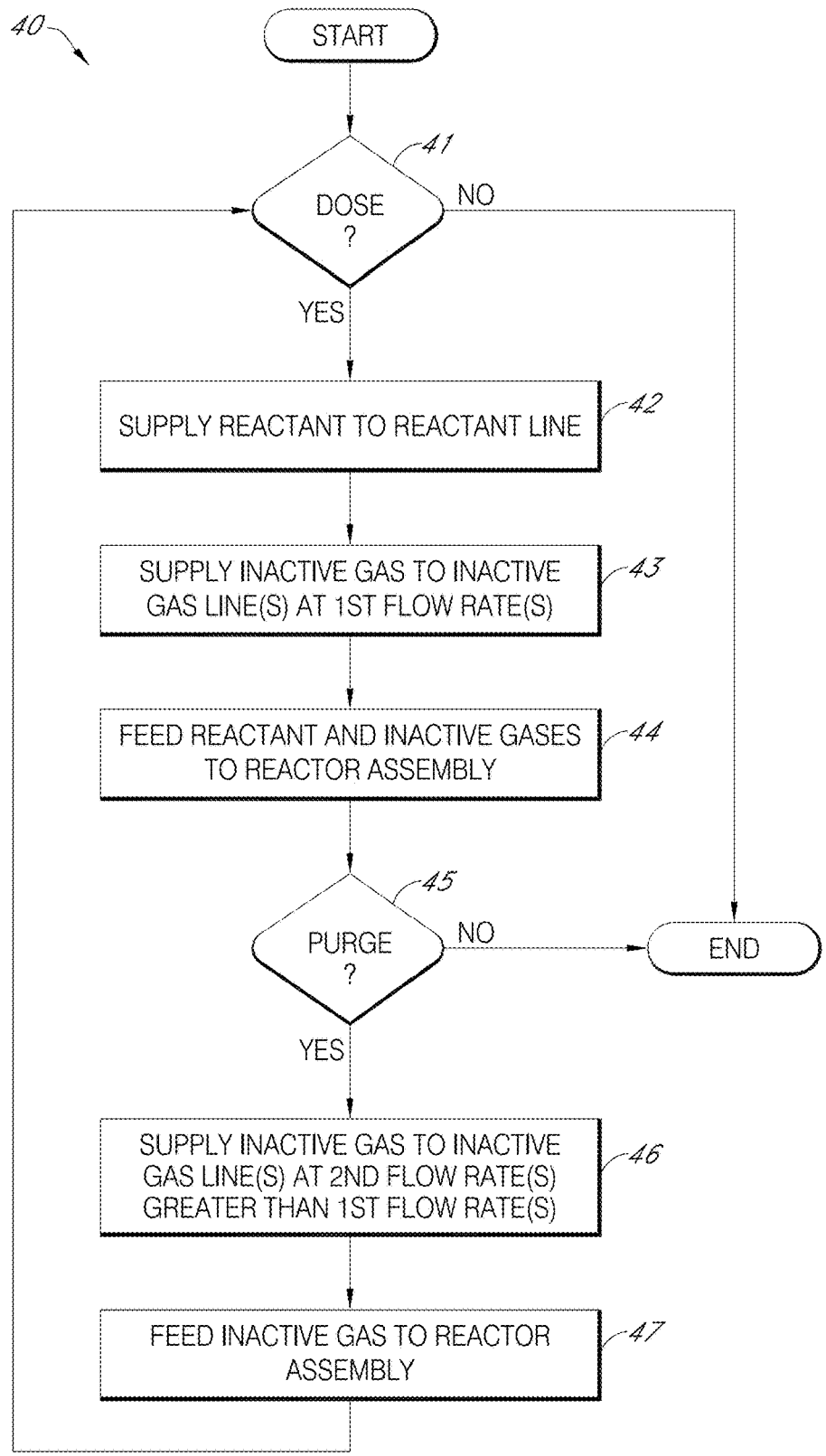
FIG. 4 is a flowchart illustrating an ALD method, according to various embodiments.

FIG. 4 is a flowchart illustrating an ALD method 40, according to various embodiments. The method 40 begins in a decision block 41 to determine whether a dose of reactant vapor is to be supplied to the reactor assembly. If the decision is no, then the method 40 ends. If the decision is yes, then the method 40 moves to a block 42 to supply a reactant vapor to a reactant line. As explained herein, a reactant gas valve can be switched to allow the flow of reactant vapor to the reactant gas line. In some embodiments, the vapor pressure of the reactant vapor can be sufficiently high so as to flow through the reactant gas line when the valve is opened. In other embodiments, an inactive carrier gas can flow through a portion of the reactant vapor source to drive the reactant vapor along the reactant gas line. In some embodiments, the ALD device comprises multiple reactant vapor sources and multiple associated reactant gas lines.

Moving to a block 43, inactive gas is supplied to inactive gas line(s) at first flow rate(s). As explained herein, a flow controller, such as an MFC, can be used to regulate the flow of inactive gas. In some embodiments, the flow controller can enable relatively constant flow rate of inactive gas through each inactive gas line. In some embodiments, multiple inert gas lines are fed by a common inert gas distribution channel. As explained herein, in various embodiments, each inert gas line can include a shutoff valve (which may have an open state and a closed state) and an adjustable valve, such as a needle valve, that can be set at a plurality of different flow rates. The adjustable valves can each be kept at a constant setting throughout the deposition process in some embodiments.

Furthermore, as explained herein, a bypass line (e.g., a foreline) can connect to and serve as a bypass around the inactive gas line(s) and the reactant gas line. In some embodiments, the bypass line can also include a shutoff valve (which may have an open state and a closed state) and an adjustable valve, such as a needle valve, that can be set at a plurality of different flow rates. The adjustable valve along the bypass line can be set so as to allow some flow of inactive gas through the bypass line during dosing. For example, in some embodiments, the adjustable valve can be set to be significantly more open than the conductance of the flow through the adjustable valve disposed along the inactive gas line(s). In such a manner, during dosing, a portion (e.g., a majority in some embodiments) of the inactive gas can flow along the bypass line, and another portion (e.g., a minority in some embodiments) of the inactive gas can flow through the inactive gas line(s).

In a block 44, the reactant and inactive gases can be fed to a reactor assembly along a feed line. As explained above, the pressure of the reactant vapor can be sufficiently high as to entrain the reactant vapor with the inert gas as it enters the reactor assembly. In some embodiments, the merged reactant and inert gases can be mixed in a mixer, and subsequently delivered to a process chamber by way of a process chamber feed line. In other embodiments, the merged gases can be fed to the process chamber without an intervening mixer.

Moving to a decision block 45, a decision is made as to whether the reactor assembly is to be purged. If no additional purging is desired, the method 40 ends. If additional purging is desired, the method 40 moves to a block 46, in which inactive gas is supplied to the inactive gas line(s) at second flow rate(s) greater than the first flow rate(s). As explained herein, increasing the flow rate during purging can beneficially reduce processing time and improve the IGV diffusion barrier. The adjustable valve(s) along the inert gas line(s) can be tuned or set such that the desired increase in flow rate(s) is/are achieved during purging.

The method 40 moves to a block 47, in which the inactive gas is fed to the reactor assembly. The inactive gas can thereby purge the reactor assembly of unused reactant, byproducts, and/or other undesirable materials. The method 40 returns to the decision block 41 to determine whether another dose state of another (or the same) reactant is desired. The method 40 can be repeated until the thin film is formed on the substrate at the desired thickness and uniformity.

Although the foregoing has been described in detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention. Moreover, not all of the features, aspects and advantages described herein above are necessarily required to practice the present invention.

What is claimed is:

1. An atomic layer deposition (ALD) method comprising:
   pulsing a first reactant vapor into a reactor assembly, the pulsing comprising:
      supplying the first reactant vapor to a first reactant gas line;
      supplying an inactive gas to a first inactive gas line at a first flow rate; and
      feeding the first reactant vapor and the inactive gas to the reactor assembly by way of a first feed line; and
   purging the reactor assembly, the purging comprising:
      supplying the inactive gas to the first inactive gas line at a second flow rate that is higher than the first flow rate;
      feeding a first portion of the inactive gas back along a diffusion barrier portion of the first reactant gas line to provide an inert gas valve (IGV) upstream of the first inactive gas line; and feeding a second portion of the inactive gas to the reactor assembly by way of the first feed line.

2. The ALD method of claim 1, further comprising applying suction to the first inactive gas line and to the first reactant line by way of a bypass line connected to a vacuum source.

3. The ALD method of claim 2, further comprising, during the pulsing, suctioning the inactive gas from the first inactive gas line through the bypass line at a third flow rate.

4. The ALD method of claim 3, during the purging, closing a bypass line valve to withdraw the suctioning from the first inactive gas line.

5. The ALD method of claim 4, further comprising:
pulsing a second reactant vapor into the reactor assembly, the pulsing the second reactant vapor comprising:
supplying the second reactant vapor to a second reactant gas line;
supplying the inactive gas to a second inactive gas line at a fourth flow rate; and
feeding the second reactant vapor and the inactive gas to the reactor assembly by way of a second feed line; and
additionally purging the reactor assembly, the additionally purging comprising:
supplying the inactive gas to the second inactive gas line at a fifth flow rate that is higher than the fourth flow rate; and
feeding the inactive gas to the reactor assembly by way of the second feed line.

6. The ALD method of claim 5, further comprising sequentially pulsing the first reactant vapor, purging the reactor assembly, pulsing the second reactant vapor, and additionally purging the reactor assembly.

7. The ALD method of claim 5, wherein the bypass line is in fluid communication with the first and second inactive gas lines by way of an inactive gas distribution line, the method comprising applying suction to the first and second inactive gas lines with the bypass line by way of the inactive gas distribution line.

8. The ALD method of claim 5, wherein the fifth flow rate is higher than the second flow rate.

9. The ALD method of claim 4, further comprising regulating gas flow through the first inactive gas line with an adjustable valve.

10. The ALD method of claim 9, wherein regulating the gas flow through the first inactive gas line comprises creating a pressure gradient across the adjustable valve.

11. The ALD method of claim 10, further comprising, during the purging, rapidly increasing the pressure of the inactive gas in the first inactive gas line and the feed line.

12. The ALD method of claim 9, further comprising regulating gas flow through the bypass line with a second adjustable valve.

13. The ALD method of claim 12, further comprising adjusting the second adjustable valve to have a higher flow conductance than the first adjustable valve.

* * * * *